United States Patent [19]
Kustera et al.

[11] Patent Number: 6,094,044
[45] Date of Patent: Jul. 25, 2000

[54] AC CURRENT SENSOR HAVING HIGH ACCURACY AND LARGE BANDWIDTH

[75] Inventors: Daniel Kustera, Franklin Square, N.Y.; Shaun Goodwin, East New Market, Md.

[73] Assignee: Airpax Corporation, LLC, Frederick, Md.

[21] Appl. No.: 09/310,698

[22] Filed: May 7, 1999

Related U.S. Application Data

[60] Provisional application No. 60/084,531, May 7, 1998.

[51] Int. Cl.$^7$ .................................................. G01R 19/00
[52] U.S. Cl. .......................................................... 324/127
[58] Field of Search ............................... 324/127, 117 R, 324/244, 126, 128

[56] References Cited

U.S. PATENT DOCUMENTS

| | | | |
|---|---|---|---|
| 4,245,187 | 1/1981 | Wagner et al. | 324/54 |
| 4,345,198 | 8/1982 | Wolfinger | 322/25 |
| 4,536,706 | 8/1985 | Kemper | 324/117 R |
| 4,591,795 | 5/1986 | McCorkle | 328/5 |
| 4,616,176 | 10/1986 | Mercure et al. | 324/127 |
| 4,709,205 | 11/1987 | Baurand et al. | 324/127 |
| 4,829,298 | 5/1989 | Fernandes | 340/870.27 |
| 5,006,769 | 4/1991 | Posedel | 318/434 |
| 5,055,816 | 10/1991 | Altman et al. | 336/200 |
| 5,323,330 | 6/1994 | Asplund et al. | 364/492 |
| 5,414,400 | 5/1995 | Gris et al. | 336/174 |
| 5,432,438 | 7/1995 | Baumgartner et al. | 324/127 |
| 5,442,280 | 8/1995 | Baudart | 324/127 |
| 5,461,309 | 10/1995 | Baudart | 324/127 |
| 5,552,978 | 9/1996 | Moncorge | 363/89 |
| 5,630,957 | 5/1997 | Adkins et al. | 219/665 |
| 5,726,846 | 3/1998 | Houbre | 361/93 |
| 5,804,965 | 9/1998 | Woolley | 324/244 |
| 5,815,391 | 9/1998 | Pelly | 363/98 |
| 5,834,934 | 11/1998 | Baurand et al. | 324/127 |
| 5,877,691 | 3/1999 | Suptitz et al. | 340/638 |

OTHER PUBLICATIONS

Ray W. F., and Davis R. M., "Wide bandwidth Rogowski transducers: Part l—The Rogowski coil" EPE Journal, vol. 1, No. 1, pp. 51–59, Mar. 1993.

Ray, WF & Davis, RM; "Wide Bandwidth Rogowski current transducers: Part I The Regowski Coil"; EPE Journal, vol. 3, No. 1, Mar. 1993, pp. 51–59.

Ray, W.F; "Wide Bandwidth Rogowski current tranducers Part ll–The Integrator"; EPE Journal, vol. 3, No. 2, Jun. 1993, pp. 116–122.

Ray, W.F & Murray, K.D; "The Use of Rogowski coils for current waveform measurement in power electronic circuits"; EPE Conf. Proc. (Florence), vol. 3, 1991, pp. 379–383.

Ray, WF; "Rogowski transducers for high bandwidth high current measurement", IEEE, 1994, pp. 10/1–10/6.

Power Electronic Measurements Ltd. http://www.proweb.co.uk/~pemltd/intro.htm.

*Primary Examiner*—Josie Ballato
*Assistant Examiner*—T. R. Sundaram
*Attorney, Agent, or Firm*—Milde, Hoffberg & Macklin, LLP

[57] ABSTRACT

A method and apparatus for processing in output of an inductive sensor, including integrating the output of the inductive sensor with an integrator, having a transfer function with at least two zeros, and at least three poles having characteristic frequencies above the zeros, having a greater number of said poles than said zeros, wherein an integration is performed at frequencies above the characteristic frequencies of the poles, and low frequency noise is substantially rejected at frequencies below the poles. The inductive sensor may be, for example, a Rogowski coil.

29 Claims, 7 Drawing Sheets

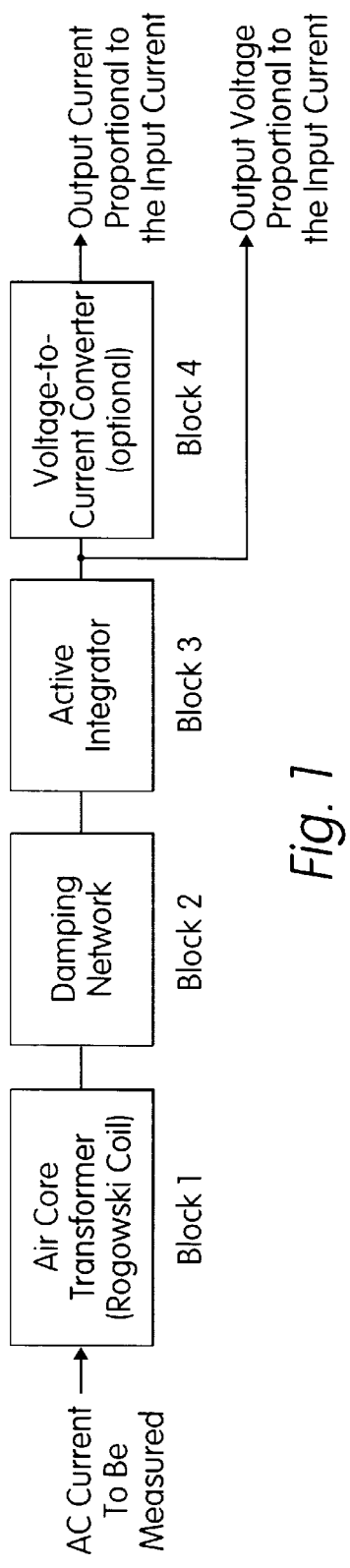
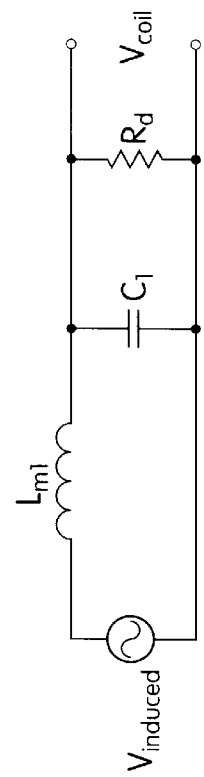
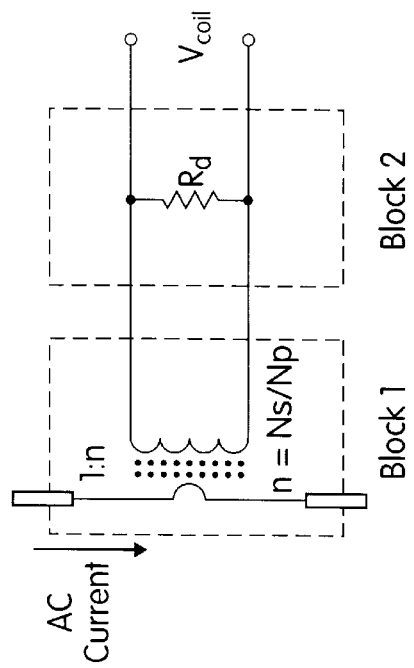

AC CURRENT SENSOR HAVING HIGH ACCURACY AND LARGE BANDWIDTH

The present application claims the benefit of priority U.S. Provisional Patent application Ser. No. 60/084,531, filed May 7, 1998.

FIELD OF THE INVENTION

The present invention relates to the field of inductively coupled current sensors, and more particularly to improvements in the output circuitry for a Rogowski coil type current sensor having high accuracy and large bandwidth.

BACKGROUND OF THE INVENTION

A Rogowski coil based current sensor is known for use as a current sensor. The Rogowski current transformer or coil is simply an air core current transformer with the secondary lightly loaded (almost left open). The Rogowski coil offers the known advantages of low power dissipation, high bandwidth, low complexity, no hysteresis errors, and no saturation problems, (air core).

In a typical Rogowski coil-based current sensor, an air core transformer is formed, magnetically coupling an AC current to be measured with an output coil. The primary, generally a single turn coil is coupled with the secondary, both of which are wound around a common coil-former, and induces a voltage in the secondary proportional to the first derivative of the current. The Rogowski coil is typically formed on a toroidal core former. The current in the primary loop is subsequently coupled to a secondary loop. which, as stated above is lightly loaded, so that the output of the secondary loop accurately represents the current waveform in the primary loop. The secondary of the transformer is electrically coupled to a damping network, the output of which is integrated to produce a waveform corresponding to the AC current waveform.

FIG. 1 shows a block diagram of a known current sensing system. The Rogowski current transformer is wound on an insulating coil former. A coil that is wound with a single layer forms a parasitic turn caused by the pitch advancement of each turn around the loop. In order to cancel the effect of this turn, a turn is wound in the opposite direction and is embedded centrally in the cross section of the coil. A coil wound with a single layer is preferable since multiple layers would increase the capacitance of the winding and thus decrease the usable bandwidth of the coil. A parasitic capacitance still exists in the single layer construction, between the cancellation turn and the winding.

FIG. 2 shows the schematic representation of blocks one and two of FIG. 1. The current in the single turn primary winding is the current to be measured. The damping network is a resistor that is used to damp the response of the coil when fast changes in current occur. The second order nature of the coil transfer function is shown in the schematic representation of the Rogowski coil and damping network shown in FIG. 3. The circuit shown approximates the Rogowski coil behavior. The inductor in the circuit is the magnetizing inductance of the coil, and the capacitor is the parasitic capacitance of the cancellation turn, discussed above. The voltage source represents the voltage that is induced in the secondary due to the presence of the primary current. The induced voltage as a function of the primary current $i_p$, coil former height h, number of turns of the secondary $N_s$, coil former inner $r_i$, and outer $r_o$, radius, and the permeability of air $\mu_o$, is:

$$V_{induced} = \frac{\mu_o \cdot h \cdot N_s}{2 \cdot \pi} \ln\left(\frac{r_o}{r_i}\right) \cdot \frac{d i_p}{d t} \qquad \text{Eq. 1}$$

Equation 1 thus defines the output of the Rogowski coil. The equation for the induced voltage shows that the voltage is proportional to the derivative of the primary current. Therefore, the output will increase as the frequency or amplitude of the primary current increases. The output of the coil must therefore be integrated to reconstruct the primary current waveshape.

The value of $R_d$ is chosen so that critical damping is achieved (in combination with the input impedance of circuitry attached to the output of the coil). Overdamping of the coil would result in a substantial reduction in the sensor bandwidth.

A basic active inverting integrator, which can be found in commercial Rogowski coil based current sensors is shown in FIG. 4. This integrator consists of an operational amplifier, resistors and a capacitor. Commercially available integrated circuit operational amplifiers have voltage and current noise spectral densities (in V/√Hz or A/√Hz), which are specified in their respective data sheet. The noise spectrum of an integrated circuit operational amplifier typically has the characteristics shown in FIG. 5. The region below the 1/f corner frequency is dominated by so-called flicker noise (1/f noise). The region above the 1/f corner frequency is dominated by shot noise, and has a white spectral density. The 1/f corner frequency is typically in the range of 1 Hz to 1 kHz for low noise operational amplifiers.

If the basic inverting integrator is used without the compensating resistor $R_{Compensate}$ shown in FIG. 4, the magnitude of the transfer function appears as the solid trace in FIG. 6. The dashed line represents the change in the transfer function when the compensation resistor is included. The integrator, implemented without a compensating resistor has characteristic the pole frequency, unity gain crossing frequency and low frequency gain shown in Equations 2, 3, and 4, respectively:

$$f_p = \frac{1}{2 \cdot \pi \cdot (1 + A_{oi}) \cdot R_{int} \cdot C_{int}} \qquad \text{Eq. 2}$$

$$f_o = \frac{1}{2 \cdot \pi \cdot R_{int} \cdot C_{int}} \sqrt{\frac{(A_{ol} - 1)}{(A_{ol} + 1)}} \qquad \text{Eq. 3}$$

$$A_{Vlow} = 20 \cdot \log(A_{ol}) \qquad \text{Eq. 4}$$

where $A_{ol}$ is the open loop voltage gain of the op-amp, as shown in FIG. 6, $A_{Vlow}$ is the dc and low voltage gain, shown approximately as the plateau area, $f_p$ is the pole frequency and $f_o$ is the unity gain crossing frequency.

There are a number of drawbacks in using this type of integrator for implementing a high accuracy and high bandwidth current sensor. First, the gain at low frequencies equals the extremely large open loop gain of the operational amplifier. The voltage and current noise of the operational amplifier are largest at low frequencies. Therefore, the output noise will be large since it is amplified by this gain. Second, the input offset voltage and bias current generated input voltage of the operational amplifier will also be multiplied by the open loop gain. This will cause the amplifier to saturate. If the amplifier is offset nulled, the thermal drift will cause the amplifier to saturate.

The prior art also teaches that, if it is known a priori, when the current crosses zero, a switch may be added across the integrating capacitor to periodically reset the integrator to zero. See, e.g., Pelly, U.S. Pat. No. 5,815,391, FIG. 4A, expressly incorporated herein by reference. This may eliminate the saturation problem, but it limits how long the integrator may operate before the maximum error is exceeded. This makes it impractical for integrating low frequency (60 Hz) signals with high accuracy.

Therefore, the prior art teaches the use of a compensation resistor $R_{Compensate}$. If the basic inverting integrator is implemented with the compensating resistor, the corresponding pole frequency, unity gain crossing frequency and low frequency gain are as shown in Equations 5, 6, and 7, respectively:

$$f_{p'} \approx \frac{1}{2 \cdot \pi \cdot R_{compensate} \cdot C_{int}} \qquad \text{Eq. 5}$$

$$f_o \approx \frac{1}{2 \cdot \pi \cdot R_{int} \cdot C_{int}} \sqrt{1 - \left(\frac{R_{int}}{R_{compensate}}\right)^2} \qquad \text{Eq. 6}$$

$$A_{Vlow} = 20 \cdot \log\left(\frac{R_{compensate}}{R_{int}}\right) \qquad \text{Eq. 7}$$

The use of the compensating resistor in the integrator has its drawbacks, especially in implementions of a high accuracy and high bandwidth current sensor. Although the output noise voltage of this compensated integrator is lower, because of the reduced gain at low frequencies, the location of the pole frequency will be higher for the same integrating capacitor value (as compared to the integrator without the compensation resistor). In order to achieve an accuracy in the range of about 1%, it is required that the minimum frequency to be integrated (i.e. 60 Hz) be many times higher than the pole frequency. This puts a limit on how much low frequency attenuation can be used. The result is high output noise. On the other hand, if the integration capacitor is made larger to compensate for this, by lowering the pole frequency, it will result in very low gain at the frequencies of interest for operation. This requires a Rogowski coil that is physically large to increase the input signal to the integrator.

FIG. 10 shows a schematic diagram of a proposed solution to this problem. from Ray W. F. and Davis R. M. : "Wide bandwidth Rogowski current transducers: Part I—The Rogowski coil". EPE Journal, Vol 3, No 1, March 1993, pp 51–59. The magnitude of the transfer function of this circuit is shown in FIG. 8. The form of this transfer function is:

$$\frac{V_{out}}{V_{coil}} = \frac{-A_{dc} \cdot \left[1 + j \cdot \left(\frac{f}{f_z}\right)\right]}{\left[1 + j \cdot \left(\frac{f}{f_p}\right)\right]^2} \qquad \text{Eq. 8}$$

The circuit is designed to have two coincident poles and a zero. The result of this topology is that gain at DC and low frequency can be made small. The integrator output errors associated with operational amplifier thermal drift are therefore reduced significantly. In addition, the integrator output errors associated with the operational amplifier input noise are also reduced significantly because of this low frequency attenuation. This circuit, however, still allows high gain near the pole frequency so that the coil does not have to be large (to produce a larger input signal). The high gain also reduces the drive requirements, i.e., the operational amplifier output current drive, for a given sensor range and bandwidth. This design does not come without a penalty. In this case, a detrimental phase shift error exists due to the integrator's poles and zeros (other than the phase shift due to the Rogowski coil). However, the integrator can be designed so that the phase error is not excessive.

In order for the integrator to be accurate, the location of the poles need to be approximately 60 times lower than the lowest frequency of the signal that will be measured. Besides this requirement, the zero needs to be much lower in frequency than the pole if good DC and low frequency gain is to be obtained. The realization of the low frequency zero requires large capacitors. Output errors due to resistor thermal noise are negligible if the resistors in the circuit are kept below 1 M$\Omega$. The use of the "T" network in the feedback loop of the operational amplifier allows the value of $C_2$ to be reduced. This circuit therefore is applicable as an integrator for a Rogowski coil based current sensor, to integrate low frequency signals with high accuracy and low phase shift.

Achieving an indicated accuracy output of less than ±1% error, over a wide temperature range, requires that the error due to operational amplifier thermal drift and noise be very small, which implies a small DC and low frequency gain. "Indicated accuracy" means that if a current sensor has the measuring range between 50A and 500A and an accuracy of 1%, then the error must be less than 1% of the actual reading. In the Ray and Davis circuit of shown in FIG. 10, reducing the DC and low frequency gain means that the capacitor $C_2$ must be large, so that the zero frequency is much less than the pole frequency. In a practical implementation, these goals are achieved with a value of $C_2$ so large that either an electrolytic capacitor or a large number of film capacitors would be required. Such an electrolytic capacitor must be nonpolarized, since the output is bipolar. The poor tolerance and drift characteristics of electrolytic capacitors will adversely affect the noise attenuation of the integrator. Also, the lifetime of wet electrolytic capacitors is short relative to film types. Electrolytic capacitors have wide tolerances on capacitance and are relatively unstable over temperature. Tantalum capacitors as well as film types are generally more expensive than wet electrolytic capacitors, for the same capacitance value.

Thus, some of the disadvantages of implementation of current sensors employing the Rogowski coil in the past include use of a large non-polarized electrolytic or a large non-polarized tantalum capacitor that is needed in the integrator circuit, or a large number of film capacitors to meet the desired performance. Additionally, the cumulative noise generated beneath the poles by the op-amp can be a significant contribution to the error for a highly accurate sensor, especially when other sources of error, such as thermal drift in the operational amplifier are reduced. This is true even for the circuit of Ray and Davis shown in FIG. 10, where an error of less than 1% is desired, and other error sources have been reduced. Also, the cumulative error introduced in the current sensor integrator output by the integrator capacitor $C_1$ and resistor $R_0$, for example, due to thermal drift in the two components, can cause the error in the output of the current sensor to be greater than ±1% indicated accuracy.

See, also, Ray W. F.: "Wide bandwidth Rogowski current transducers: Part II—The integrator", EPE Journal, Vol 3, No 2, June 1993, pp 116–122; Ray W. F. and Murray K. D.: "The use of Rogowski coils for current waveform measurement in power electronic circuits", EPE Conf. Proc. (Florence), Vol 3, 1991, pp 379–383; Ray W. F. "Rogowski transducers for high bandwidth high current measurement", IEE, 1994, pp 10/1–10/6: and Power Electronic Measurements Ltd.—world wide web site http://www.proweb.co.uk/~pemltd/intro.htm; and U.S. Pat. Nos. 4,345,198 and 5,877,691, all of which are expressly incorporated herein by reference.

SUMMARY OF THE INVENTION

In general, an integrator can be created as long as there is one more pole than the number of zeros in the transfer function. The transfer function of the circuit according to the present invention provides at least two zeros in its transfer function.

The present invention thus provides an improvement to the integrator of Ray and Davis by providing one or more additional pairs of poles and zeros in tie transfer function of the integrator. In this way, steeper rolloff between the peak of the passband and relatively flat low frequency performance, while providing a normal integration transfer function at frequencies greater than the peak.

Thus, in general, the low frequency performance, i.e., where the passband is flat, is similar to the prior art, although the additional degree of freedom due to the extra zero in the transfer function allows the designer flexibility to reduce the DC gain. Further, the −20 dB rolloff characteristic of the integrator function is also similar to the prior art, and indeed required for implementation of the integration function. However, between the low frequency regime and the "peak" in the transfer function, the design according to the present invention may provide a 40 dB per decade (or more) rolloff, as compared with the 20 dB per decade of the prior art design. Because of this increased rolloff in the design according to the present invention, low frequency noise from the amplifier, and other sources, below the integrator pole frequency ($f_{p1}$, $f_{p2}$, $f_{p3}$), and especially between the last zero ($f_{z2}$) and first pole ($f_{p1}$)(see FIG. 9), is substantially attenuated, as compared to the design according to the prior art (see FIG. 8).

According to this design, the size of the zero capacitors are reduced as compared to a the Ray and Davis integrator through the use of a double "T" network arrangement. The peak output noise error is reduced via a steeper rise in the integrator transfer function for frequencies above the zero frequency. The magnitude of the preferred embodiment of the transfer function of this circuit will approximate that of Equation 9 and shown in FIG. 7.

$$\frac{V_{out}}{V_{coil}} = \frac{-A_{dc} \cdot \left[1 + j \cdot \left(\frac{f}{f_z}\right)\right]^2}{\left[1 + j \cdot \left(\frac{f}{f_p}\right)\right]^3} \quad \text{Eq. 9}$$

The preferred embodiment implements an integrator containing three poles and two zeros. The three poles are designed to be coincident and the two zeros are designed to be coincident, or nearly so. In the Ray and Davis circuit the gain is +20 dB per decade after the zero frequency. In this circuit the gain is +40 dB per decade after the coincident zeros. As a result of this, the peak output noise will be lower than in the Ray and Davis circuit.

It is noted that, in likewise manner, a more complex integrator may be provided having a greater number of poles and zeros. According to the present invention, the integrator has a high frequency rolloff of −20 dB per decade in the operational range, which generally is the result of a transfer function having a number of poles which is one greater than the number of zeros. Further, the zeros have a frequency below those of the poles. Typically, the poles will be coincident, although in various circumstances it may be desirable to separate them slightly. Likewise, the zeros will also typically be coincident, at a frequency above the low frequency noise and the timeconstant of the thermal drift, but need not be superimposed, as shown in FIG. 9, wherein $f_{z1}$ and $f_{z2}$ are slightly displaced.

The transfer function shown in FIG. 7 can be realized using one or more operational amplifiers, however, a solution that requires only a single operational amplifier is generally more desirable. As shown in FIG. 11, the preferred integrator is implemented with a single operational amplifier. The magnitude of the transfer function for this integrator is shown in FIG. 9, having a transfer function of the form:

$$\frac{V_{out}}{V_{coil}} = \frac{-A_{dc} \cdot \left[1 + j \cdot \left(\frac{f}{f_{z1}}\right)\right] \cdot \left[1 + j \cdot \left(\frac{f}{f_{z2}}\right)\right]}{\left[1 + j \cdot \left(\frac{f}{f_p}\right)\right]^3} \quad \text{Eq. 10}$$

It should be understood that this transfer function can be realized by other circuit configurations. The three poles are designed to be coincident. The two zeros are split. The degree of separation between these zeros is not large and therefore approximates the desired transfer function, as demonstrated by a comparison of FIGS. 7 and 9.

A new integrator circuit is provided that reduces the value of the required capacitors and reduces the peak output noise. Capacitors such as metallized polypropylene have good tolerance and drift characteristics and can now be used. These capacitors also have a long lifetime.

The design according to the present invention, having a desired integrator transfer function with at least two zeros, can be implemented in many different ways, for example using multiple operational amplifier filter techniques that can reduce the sensitivity of the output voltage to component tolerances and drift.

The present invention also provides a sensor system, comprising an inductive sensor, producing a differentiated output, and an integrator having at least one defined zero and two defined poles in its transfer function, having a capacitance having a thermal sensitivity reflected as a primary capacitance output error component and a resistance having a thermal sensitivity reflected as a primary resistance output error component, wherein the improvement comprises providing components having the capacitance with a thermal temperature coefficient approximately equal and opposite to a thermal temperature coefficient of components defining the resistance, wherein the components defining the resistance and capacitance are maintained at the same temperature. This sensor system is capably of high accuracy over a wide temperature range, for example better than about 1% indicated accuracy, over a range of between about 10–100% of full scale, for example over a temperature range of −40 to +85C.

BRIEF DESCRIPTION OF THE DRAWINGS

These and further objects and advantages of the invention will be more apparent upon reference to the following specification, claims and appended drawings wherein:

FIG. 1 shows a schematic diagram of a Rogowski coil current sensor type system;

FIG. 2 shows a schematic diagram of an embodiment of the Rogowski coil and damping network of the system shown in FIG. 1;

FIG. 3 shows an alternate representation of the schematic diagram of an embodiment of the Rogowski coil and damping network of the system shown in FIG. 2;

DETAILED DESCRIPTION OF THE PREFERRED EMBODIMENTS

Figure 5:
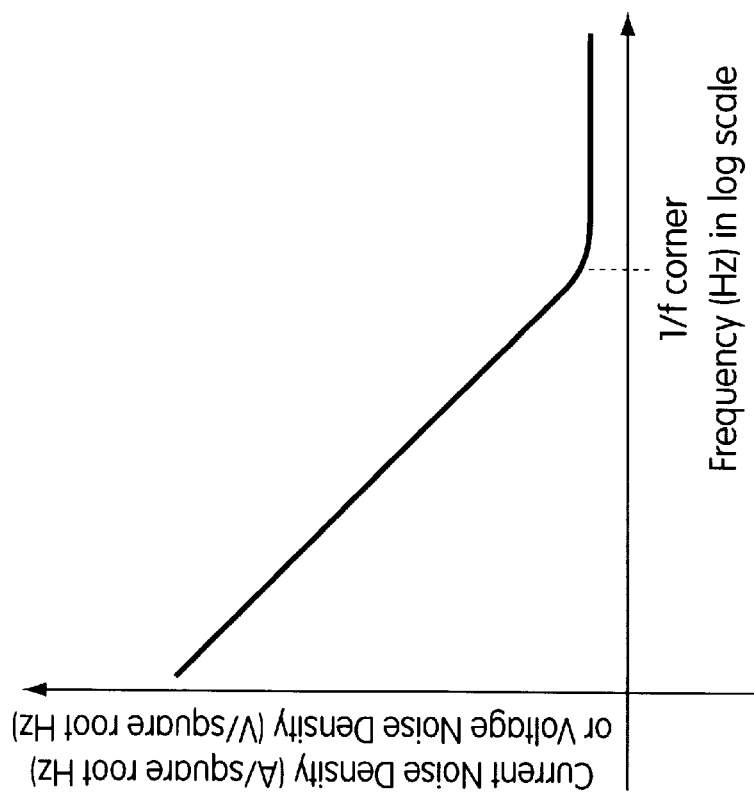
FIG. 5 shows a noise density plot for a typical operational amplifier.
Figure 4:
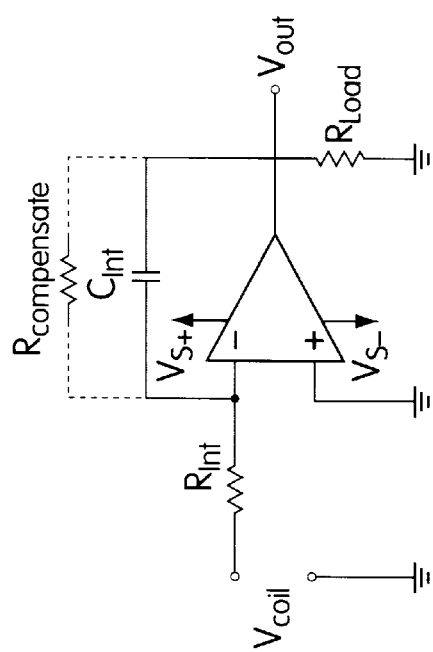
FIG. 4 shows a schematic diagram of a known active integration circuit.
Figure 7:
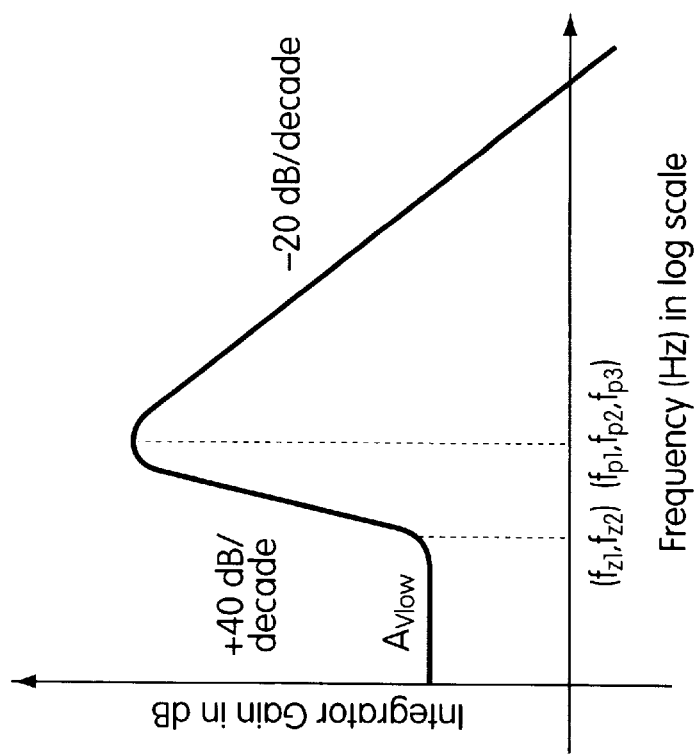
FIG. 7 shows an ideal transfer function of an improved integrator according to the present invention having two zeros superposed and three superposed poles.
Figure 6:
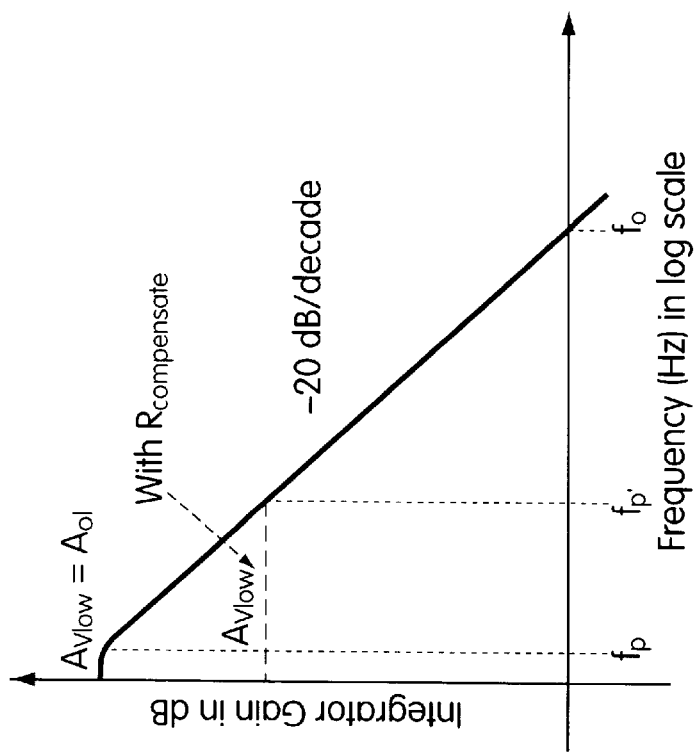
FIG. 6 shows a transfer function of an integrator according to FIG. 4.

The preferred embodiments will no be described by way of example, in which like reference numerals indicate like elements.

Figure 9:
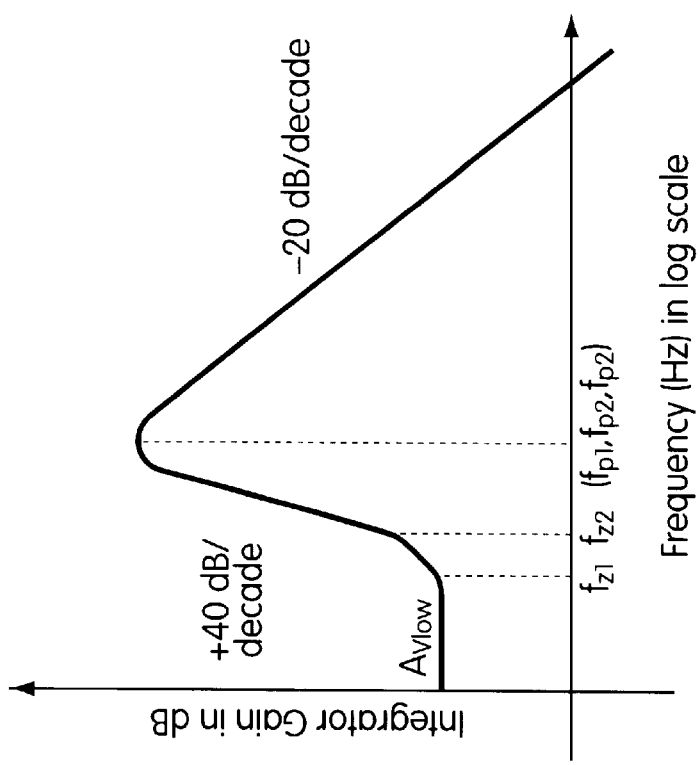
FIG. 9 shows a transfer function of an improved integrator according to the present invention having two separated zeros and three superposed poles.
Figure 8:
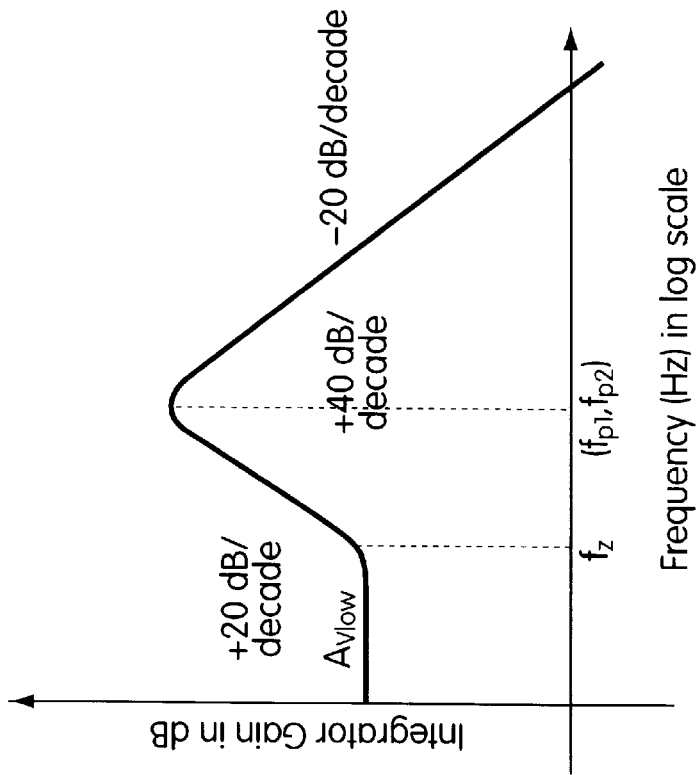
FIG. 8 shows a prior art integrator transfer function with one zero and two poles.
Figure 11:
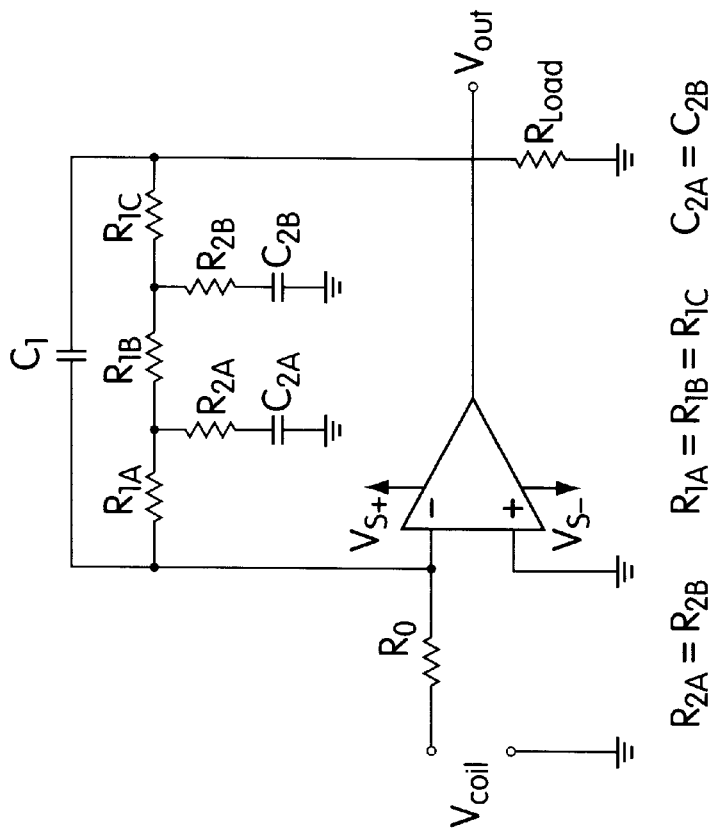
FIGS. 11 and 12 show, respectively a simplified and detailed schematic diagram of an integrator according to the present invention, having the transfer function as set forth in FIG. 9.
Figure 10:
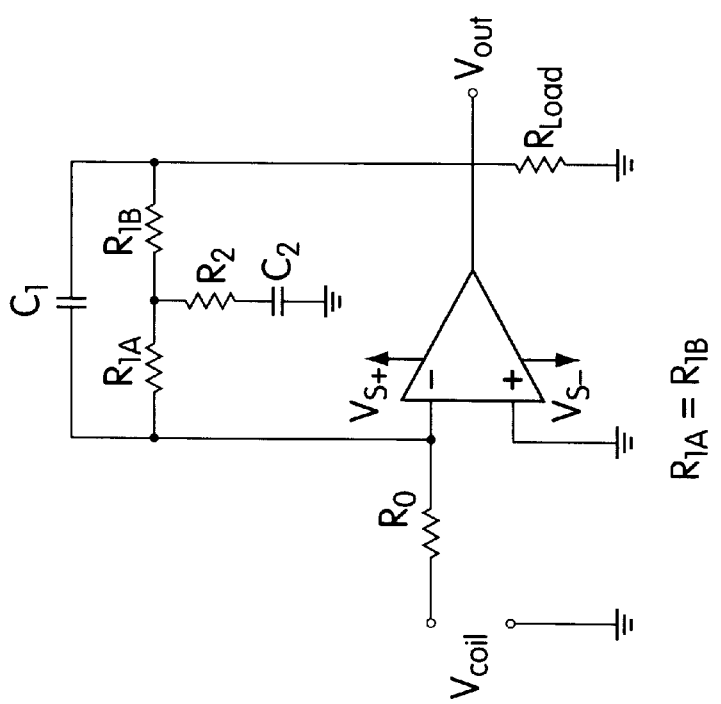
FIG. 10 shows a schematic diagram of a known integrator, having the transfer function as set forth in FIG. 8.
Figure 12:
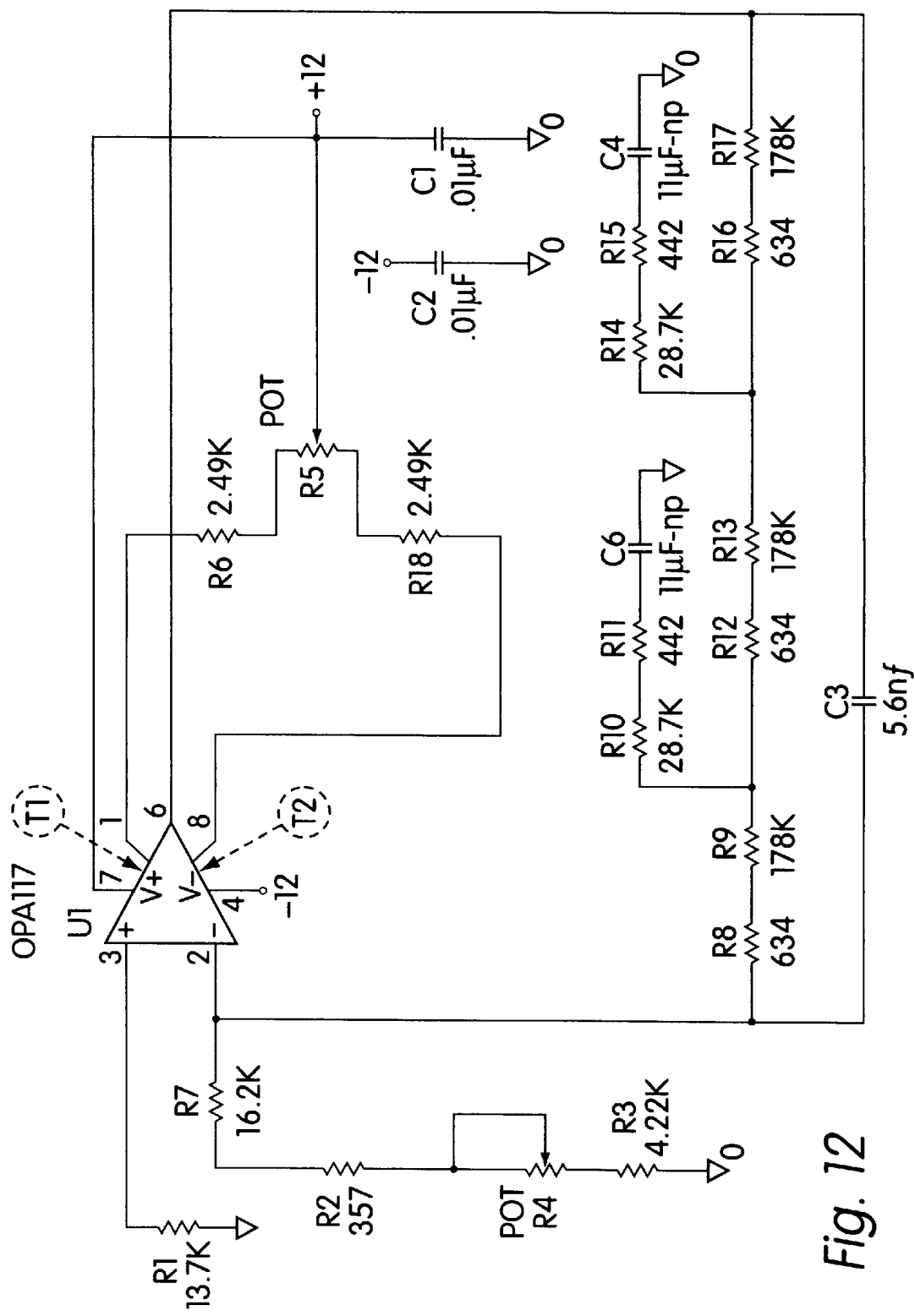
Figure 13:
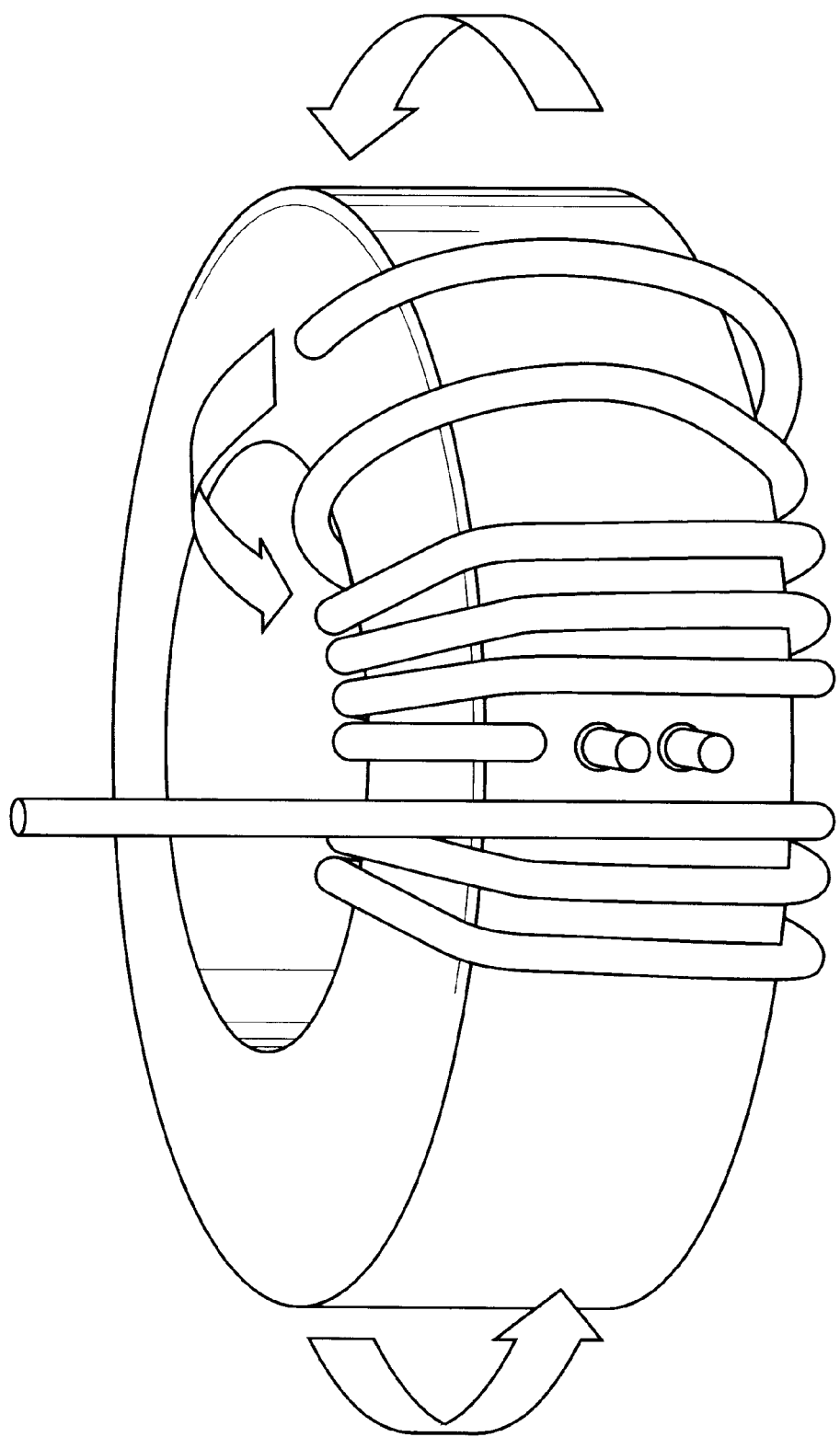
FIG. 13 shows a perspective view of a Rogowski coil suitable for use with the present invention.

A theoretical analysis is performed on implementations of the Ray and Davis circuit, schematically shown in FIG. 10, having the transfer function graphically represented in FIG. 8, and a preferred embodiment of the circuit according to the present invention, schematically shown in FIGS. 11 and 12, and having the transfer function shown in FIG. 9. The results of which are shown in Tables 1 to 10, described in more detail below. Two different designs of the Ray and Davis circuit are analyzed to illustrate the performance difference. Common design parameters are selected for all three circuits, in order to allow a fair comparison to be made. All three analyses employ the same Rogowski coil current sensor, described on pages 1–6 of the Appendix, and use the same operational amplifier, an OPA177.

All designs share the same pole frequency location, 0.9 Hz and the same DC/low frequency gain. The Ray and Davis-inspired circuit, whose design and performance is described in the Appendix, "comparison test 1" is designed with no restriction on the size of $C_2$, resulting in a $C_2$ value of 84.5 $\mu F$. In this case, the circuit is most comparable in performance to the design according to the present invention. The Ray and Davis-inspired circuit entitled "comparison test 2" is shown to illustrate what would happen if the capacitor $C_2$ was made equal to the largest value in the circuit according to the present invention, 11 $\mu F$. The current sensors are assumed to operate between –40 degrees C. and +85 degrees C. The maximum peak current for these designs is 500 Amps. The design parameter for minimum current within the stated accuracy is 50 Amps, though typically, high accuracy performance extends to lower current levels, especially with thermal compensation of critical passive components.

Typical industrial mains Rogowski Coil current sensors are useful over a range of frequencies from 50 Hz to 200 kHz.

The value of $C_2$ in comparison test 1 (see Table 1) is large and requires the use of a nonpolarized electrolytic type of capacitor. Generally speaking, capacitor values less than 22 $\mu f$ if are required if metallized polypropylene film capacitors (or other similar film type capacitors) are to be used. The total performance of these sensors which includes the effect of thermal drift (on the operational amplifier and components) is shown in Table 3. The design spreadsheets provide the details of the respective designs and assumed drift compensation methods, that result in the performance shown.

For all tables, theoretical results are for a 500A sensor, with a minimum design current of 50A.

TABLE 1

| | Design Specifications | | |
|---|---|---|---|
| | Two Pole One Zero Comparison Test 1 (Ray & Davis ckt.) | Two Pole One Zero Comparison Test 2 (Ray & Davis ckt.) | Three Pole Two Zero (New ckt.) |
| Integrator component values | R0 = 16.803 K<br>R1 = 252.838 K<br>R2 = 4.149 K<br>C1 = 5.6 nf<br>C2 = 84.6 uf | R0 = 129.104 K<br>R1 = 1.943 M<br>R2 = 31.88 K<br>C1 = 729 pf<br>C2 = 11 uf | R0 = 16.803 K<br>R1 = 168.549 K<br>R2 = 26.529 K<br>C1 = 5.6 nf<br>C2 = 11 uf |
| DC & low frequency gain | 29.569 dB | 29.569 dB | 29.569 dB |
| Pole frequency | 0.9 Hz | 0.9 Hz | 0.9 Hz |
| Required OP AMP drive current | 6.433 mA | 1.533 mA | 6.433 mA |
| Nominal phase shift in degrees | 1.703 | 1.703 | 2.338 |
| Nominal peak output noise voltage | 0.310 mV | 2.30 mV | 0.201 mV |

TABLE 1-continued

Design Specifications

|  | Two Pole One Zero Comparison Test 1 (Ray & Davis ckt.) | Two Pole One Zero Comparison Test 2 (Ray & Davis ckt.) | Three Pole Two Zero (New ckt.) |
|---|---|---|---|
| Total output voltage drift due to thermal drift of OP AMP only (65 degree rise) | 3.829 mV | 15.91 mV | 3.829 mV |

TABLE 2

Total Output Error using Nominal Component Values

| Peak current value & frequency | Two Pole One Zero Comparison Test 1 (Ray & Davis ckt.) | Two Pole One Zero Comparison Test 2 (Ray & Davis ckt.) | Three Pole Two Zero (New ckt.) |
|---|---|---|---|
| I = 50 A f = 60 Hz | +0.517% <br> −0.517% | +2.276% <br> −2.276% | +0.504% <br> −0.504% |
| I = 50 A, f = 5200 Hz | +0.54% <br> −0.495% | +2.298% <br> −2.254% | +0.53% <br> −0.478% |
| I = 50 A, f = 20 kHz | +0.535% <br> −0.5% | +2.294% <br> −2.259% | +0.525% <br> −0.483% |
| I = 50 A, f = 200 kHz | +0.045% <br> −0.99% | +1.803% <br> −2.749% | +0.035% <br> −0.973% |

TABLE 3

Total Output Error based on a Practical Implementation using Worst Case Component Tolerance and Drift

| Peak current value & frequency | Two Pole One Zero Comparison Test 1 (Ray & Davis ckt.) | Two Pole One Zero Comparison Test 2 (Ray & Davis ckt.) | Three Pole Two Zero (New ckt.) |
|---|---|---|---|
| I = 50 A, f = 60 Hz | +1.284% <br> −1.072% | +3.077% <br> −2.866% | +1.274% <br> −1.052% |
| I = 50 A, f = 5200 Hz | +1.303% <br> −1.054% | +3.098% <br> −2.848% | +1.294% <br> −1.036% |
| I = 50 A, f = 20 kHz | +1.298% <br> −1.059% | +3.093% <br> −2.853% | +1.289% <br> −1.041% |
| I = 50 A, f = 200 kHz | +0.804% <br> −1.546% | +2.599% <br> −3.341% | +0.795% <br> −1.528% |

TABLE 4

Breakdown of Contributing Error Sources in the Practical Implementations

| Peak current value & frequency | Error Sources | Two Pole One Zero Comparison Test 1 (Ray & Davis ckt.) | Two Pole One Zero Comparison Test 2 (Ray & Davis ckt.) | Three Pole Two Zero (New ckt.) |
|---|---|---|---|---|
| I = 50 A, f = 60 Hz | Coil + Integrator w/ nominal component values | 0 | 0 | 0 |
|  | OP AMP thermal drift | +0.479% <br> −0.494% | +2.014% <br> −2.029% | +0.479% <br> −0.494% |
|  | Peak noise | +0.039% <br> −0.041% | +0.299% <br> −0.3% | +0.026% <br> −0.027% |
|  | Component tolerance and thermal drift | +0.766% <br> −0.537% | +0.763% <br> −0.537% | +0.768% <br> −0.531% |
| I = 50 A, f = 5200 Hz | Coil + Integrator w/ nominal component values | +0.022% | +0.022% | +0.026% |

TABLE 4-continued

Breakdown of Contributing Error Sources in the Practical Implementations

| Peak current value & frequency | Error Sources | Two Pole One Zero Comparison Test 1 (Ray & Davis ckt.) | Two Pole One Zero Comparison Test 2 (Ray & Davis ckt.) | Three Pole Two Zero (New ckt.) |
|---|---|---|---|---|
| | OP AMP thermal drift | +0.479% −0.494% | +2.014% −2.029% | +0.479% −0.494% |
| | Peak noise | +0.039% −0.041% | +0.299% −0.3% | +0.026% −0.027% |
| | Component tolerance and thermal drift | +0.762% −0.541% | +0.762% −0.541% | +0.763% −0.541% |
| I = 50 A, f = 20 kHz | Coil + Integrator w/ nominal component values | +0.018% | +0.018% | +0.021% |
| | OP AMP thermal drift | +0.479% −0.494% | +2.014% −2.029% | +0.479% −0.494% |
| | Peak noise | +0.039% −0.041% | +0.299% −0.3% | +0.026% −0.027% |
| | Component tolerance and thermal drift | +0.762% −0.541% | +0.762% −0.541% | +0.762% −0.542% |
| I = 50 A, f = 200 kHz | Coil + Integrator w/ nominal component values | −0.473% | −0.473% | −0.469% |
| | OP AMP thermal drift | +0.479% −0.494% | +2.014% −2.029% | +0.479% −0.494% |
| | Peak noise | +0.039% −0.041% | +0.299% −0.3% | +0.026% −0.027% |
| | Component tolerance and thermal drift | +0.758% −0.538% | +0.758% −0.539% | +0.759% −0.538% |

TABLE 5

Peak Output Noise Levels

| | Two Pole One Zero Comparison Test 1 (Ray & Davis ckt.) | Two Pole One Zero Comparison Test 2 (Ray & Davis ckt.) | Three Pole Two Zero (New ckt.) |
|---|---|---|---|
| Nominal peak output noise voltage | 0.310 mV | 2.298 mV | 0.201 mV |
| Worst case change due to component tolerance & thermal drift | +11.55% | +4.74% | +6.49% |
| Resulting peak output noise voltage | 0.346 mV | 2.406 mV | 0.214 mV |
| Smallest theoretical current measurable with +/−1% error (assumes the only error sources are noise & the coil with nominal integrator component values) | 2.15 A | 15 A | 1.33 A |

TABLE 6

Phase Shift Errors

| | Two Pole One Zero Comparison Test 1 (Ray & Davis ckt.) | Two Pole One Zero Comparison Test 2 (Ray & Davis ckt.) | Three Pole Two Zero (New ckt.) |
|---|---|---|---|
| Nominal Phase Shift at 60 Hz in degrees | 1.703 | 1.703 | 2.338 |

TABLE 6-continued

Phase Shift Errors

|  | Two Pole One Zero Comparison Test 1 (Ray & Davis ckt.) | Two Pole One Zero Comparison Test 2 (Ray & Davis ckt.) | Three Pole Two Zero (New ckt.) |
|---|---|---|---|
| Worst-case change due to component tolerance & thermal drift | +8.91% | +8.91% | +10.97% |
| Resulting phase shift | 1.854 | 1.854 | 2.595 |

TABLE 7

Change in Ouput Voltage as a Percentage of the Nominal Value for a 1% Decrease in the Nominal Component Value

|  | Two Pole One Zero Comparison Test 1 (Ray & Davis ckt.) | Two Pole One Zero Comparison Test 2 (Ray & Davis ckt.) | Three Pole Two Zero (New ckt.) |
|---|---|---|---|
| $V_{out} \sim R0$ | +1.01% | +1.01% | +1.01% |
| $V_{out} \sim R1A$ | −0.0007% | −0.0007% | −0.001% |
| $V_{out} \sim R1B$ | −0.0007% | −0.0007% | −0.0009% |
| $V_{out} \sim R1C$ | — | — | −0.001% |
| $V_{out} \sim R2A$ or R2 | +0.0009% | +0.0009% | +0.001% |
| $V_{out} \sim R2B$ | — | — | +0.001% |
| $V_{out} \sim C1$ | +1.01% | +1.01% | +1.01% |
| $V_{out} \sim C2A$ or C2 | +0.0002% | +0.0002% | +0.0003% |
| $V_{out} \sim C2B$ | — | — | +0.0003% |

TABLE 8

Change in Phase Shift as a Percentage of the Nominal Value for a 1% Decrease in the Nominal Component Value

|  | Two Pole One Zero Comparison Test 1 (Ray & Davis ckt.) | Two Pole One Zero Comparison Test 2 (Ray & Davis ckt.) | Three Pole Two Zero (New ckt.) |
|---|---|---|---|
| Phase Shift ~ R0 | 0% | 0% | 0% |
| Phase Shift ~ R1A | +0.995% | +0.995% | +0.887% |
| Phase Shift ~ R1B | +0.995% | +0.995% | +0.793% |
| Phase Shift ~ R1C | — | — | +0.887% |
| Phase Shift ~ R2A (R2) | −0.969% | −0.969% | −0.774% |
| Phase Shift ~ R2B | — | — | −0.774% |
| Phase Shift ~ C1 | +1.01% | +1.01% | +1.01% |
| Phase Shift ~ C2A (C2) | +0.0002% | +0.0002% | +0.0003% |
| Phase Shift ~ C2B | — | — | +0.0003% |

TABLE 9

Change in Output Voltage Drift (due to OP AMP only) as a Percentage of the Nominal Value for a 1% Decrease in the Nominal Component Value

|  | Two Pole One Zero Comparison Test 1 (Ray & Davis ckt.) | Two Pole One Zero Comparison Test 2 (Ray & Davis ckt.) | Three Pole Two Zero (New ckt.) |
|---|---|---|---|
| Thermal Drift ~ R0 | +0.516% | +0.124% | +0.516% |
| Thermal Drift ~ R1A | −0.492% | −0.498% | −0.328% |
| Thermal Drift ~ R1B | −0.492% | −0.498% | −0.328% |
| Thermal Drift ~ R1C | — | — | −0.328% |

TABLE 10

Change in Peak Output Noise Voltage as a Percentage of the Nominal Value for a 1% Decrease in the Nominal Component Value

| | Two Pole One Zero Comparison Test 1 (Ray & Davis ckt.) | Two Pole One Zero Comparison Test 2 (Ray & Davis ckt.) | Three Pole Two Zero (New ckt.) |
|---|---|---|---|
| $V_{npk} \sim R0$ | +0.069% | +0.001% | +0.087% |
| $V_{npk} \sim R1A$ | −0.876% | −0.887% | −0.762% |
| $V_{npk} \sim R1B$ | −0.876% | −0.887% | −0.679% |
| $V_{npk} \sim R1C$ | — | — | −0.762% |
| $V_{npk} \sim R2A$ or R2 | +0.594% | +0.608% | +0.538% |
| $V_{npk} \sim R2B$ | — | — | +0.538% |
| $V_{npk} \sim C1$ | +0.1% | +0.096% | +0.101% |
| $V_{npk} \sim C2A$ or C2 | −0.265% | −0.265% | −0.121% |
| $V_{npk} \sim C2B$ | — | — | −0.121% |

It can be seen that the circuit according to the present invention slightly outperforms the comparison test 1 circuit while requiring capacitors which are small enough for film type capacitors to be used. A breakdown of the error sources is shown in Table 4. It shows that a bulk of the error in all designs is the result of operational amplifier thermal drift and component tolerance and drift. At higher frequencies, the error due to the coil attenuation begins to dominate. In practice, the errors shown due to operational amplifier thermal drift will be much smaller than estimated, since the analysis assumes the use of maximum drift, rather than typical drift, described in the manufacturer's data. In addition, the designs assume the use of 1% tolerance components where possible. Table 7 shows that the thermal compensation of $C_1$ by $R_0$ is critical for obtaining high accuracy. If this compensation is improved beyond linear compensation (see Appendix) and a very low tolerance is chosen for $C_1$, then the error due to the peak output noise will begin to dominate. As shown in Table 7 and described further in the spreadsheets, such compensation can by achieved by selecting $C_1$ and $R_0$ with temperature coefficients that have a substantially similar slope, but opposite magnitude (i.e., one component having a positive temperature coefficient or PTC, the other having a negative temperature coefficient, or NTC). The capacitance components, e.g., $C_1$, and the resistance components, e.g., $R_0$, should be held at the same temperature, such as by careful circuit board layout and heatsinking together. Even this, however, will not provide complete thermal compensation, since there is normally an uncertainty in the thermal drift of the components that cannot be accounted for in the design. (As shown in Table 7 and the Appendix, such thermal compensation will also be effective for matching $C_1$ and $R_0$ of the Ray and Davis inspired circuit, thus reducing the error output significantly.)

This aspect of the invention may be applied to the Ray and Davis two-pole integrator, to improve performance thereof. Therefore, it is an aspect of the present invention to provide thermal compensation for the integrator components to cancel thermal drift, and provide high accuracy, e.g., better than about 1% indicated accuracy, over a range of at least about 10–100% of full scale, for a Rogowski Coil current sensor circuit, over a wide range of temperature, e.g., between −40 to +85C.

Table 5 shows that the circuit according to the present invention has a peak output noise that is approximately 35% lower than that of the Ray and Davis inspired circuit (comparison test 1). This enables smaller currents to be measured with high accuracy.

The bandwidth of the sensor is limited by the drive current and slew rate capabilities of the operational amplifier being used, as well as by the Rogowski coil. Although the bandwidth (−3 dB point) of the Rogowski current transformer is large, the actual usable bandwidth is much smaller if high accuracy is desired (<±1%). This is because at high frequencies, the coil attenuation becomes too large. The output of the coil can be quite large if there is a sudden change in current. It is assumed that a transient suppressor is used at the output of the coil to protect the operational amplifier from being overdriven or damaged by high voltages.

Apart from the components of the integrator, other components in an AC current sensor must be selected judiciously in order to avoid the introduction of errors into the system due to the temperature drift. For example, the material selected for the Rogowski coil itself can introduce unacceptable temperature errors, due to expansion and contraction of the material used for the core former.

It is understood that the selection of Rogowski coil and integrator parameters may vary, depending on circumstances, and therefore that the aforementioned preferred design should not be construed as limiting in the scope of the invention. It is also understood that higher order filter structures may be implemented, for example, having three of more zeros in the transfer function. It is further understood that, discrete time filter structures, such as switched capacitor elements, may be used to implement all or part of the integrator system. Further, automatically nulling amplifiers, and digitally controlled amplifiers may be employed.

The integration function may also be implemented within a digital signal processor. In this case, an analog signal conditioning device will generally be required to provide an input to an analog to digital converter, and such signal conditioning device will be subject to low frequency noise generally as described above and shown in FIG. 5. The system according to the present invention may be implemented with time continuous or time discontinuous, and analog or quantized processing, as desired. The principles of the present invention provide significant advantages in the processing of Rogowski coil sensor outputs.

The invention may therefore be embodied in other specific forms without departing from the spirit or essential characteristics thereof. The present embodiments are, therefore, to be considered in all respects as illustrative and not restrictive, the scope of the invention being indicated by the appended claims rather than by the foregoing description, and all changes which come within the meaning and range of equivalency of the claims are, therefore, intended to be embraced therein. The term "comprising", as used herein, shall be interpreted as including, but not limited to inclusion of other elements not inconsistent with the structures and/or functions of the other elements recited.

What is claimed is:

1. A signal conditioning circuit for an inductive sensor, comprising an integrator, said integrator having a transfer function having a high frequency band response with an attenuation of about −20 dB per decade, a mid frequency peak characterized by at least three poles which are close in frequency, and a low frequency response below a frequency of said poles having a substantial band with a characteristic slope of greater than +20 dB per decade.

2. The signal conditioning circuit of claim 1, wherein the inductive sensor senses a magnitude of a current flowing in a circuit.

3. The signal conditioning circuit of claim 1, wherein the sensor is a Rogowski coil.

4. The signal conditioning circuit of claim 1, wherein the poles are substantially superposed.

5. The signal conditioning circuit of claim 1, wherein the low frequency response band has a characteristic slope of at least +40 dB per decade.

6. The signal conditioning circuit of claim 1, wherein the integrator is substantially implemented with a single operational amplifier, configured in a filter having two zeros and three poles.

7. The signal conditioning circuit of claim 1, wherein the integrator is substantially implemented with a single operational amplifier, configured in a filter having two zeros and three poles, the three poles being coincident and the two zeros being displaced.

8. The signal conditioning circuit of claim 1, wherein the integrator is configured as an inverting amplifier with an integrating capacitor in the feedback loop, with a compensation network in parallel to the integrating capacitor having at least two characteristic timeconstants.

9. The signal conditioning circuit of claim 1, wherein the integrator is configured as an inverting amplifier with an integrating capacitor in the feedback loop, with a compensation network in parallel to the integrating capacitor having at least two defined "T" networks, each composed of at least one capacitor and at least one resistor.

10. The signal conditioning circuit of claim 1, wherein said integrator has an indicated accuracy of better than about 1% from about 10%–100% of full scale.

11. A sensor system, comprising an inductive sensor, producing a differentiated output, and an integrator, wherein the improvement comprises providing a transfer function of said integrator having a set of at least two zeros having characteristic frequencies lower than a set of at least three poles, having a greater number of said poles than said zeros.

12. The sensor system of claim 11, wherein the inductive sensor senses a magnitude of a current flowing in an electrical circuit.

13. The sensor system of claim 11, wherein the sensor is a Rogowski coil.

14. The sensor system of claim 11, wherein the at least three poles are substantially superposed.

15. The sensor system of claim 11, wherein the integrator is substantially implemented with a single operational amplifier, configured in a filter having two zeros and three poles.

16. The sensor system of claim 11, wherein the integrator is substantially implemented with a single operational amplifier, configured in a filter having two zeros and three poles, the three poles being coincident and the two zeros being displaced.

17. The sensor system of claim 11, wherein the integrator is configured as an inverting amplifier with an integrating capacitor in the feedback loop, with a compensation network in parallel to the integrating capacitor having at least two characteristic timeconstants.

18. The sensor system of claim 11, wherein the integrator is configured as an inverting amplifier with an integrating capacitor in the feedback loop, with a compensation network in parallel to the integrating capacitor having at least two defined "T" networks, each composed of at least one capacitor and at least one resistor.

19. The sensor system of claim 11, wherein said integrator has an indicated accuracy of better than about 1% from about 10%–100% of full scale.

20. A method for processing an output of an inductive sensor, comprising integrating the output of the inductive sensor employing a transfer function having at least two zeros, and at least three poles having characteristic frequencies above the at least two zeros, having a greater number of said poles than said zeros, wherein an integration is performed at frequencies above the characteristic frequencies of the at least three poles, and low frequency noise is substantially rejected at frequencies below the at least three poles.

21. The method of claim 20, wherein the inductive sensor is a Rogowski coil.

22. The method of claim 20, wherein the integration is performed by an analog integrator having an associated resistor-capacitor network.

23. The method of claim 19, wherein the at least three poles are superposed.

24. A sensor system, comprising an inductive sensor, producing a differentiated output, and an integrator having at least one defined zero and two defined poles in its transfer function, having a capacitance having a thermal sensitivity reflected as a primary capacitance output error component and a resistance having a thermal sensitivity reflected as a primary resistance output error component, wherein the improvement comprises providing components having the capacitance with a thermal temperature coefficient approximately equal and opposite to a thermal temperature coefficient of components defining the resistance, wherein the components defining the resistance and capacitance are maintained at the same temperature.

25. The sensor system according to claim 24, wherein said capacitance component is a film capacitor.

26. The signal conditioning circuit of claim 1, wherein said integrator has an indicated accuracy of better than about 1% from about 10%–100% of full scale over a range of frequencies from 50 to 200,000 Hz.

27. The sensor system of claim 11, wherein said integrator has an indicated accuracy of better than about 1% from about 10%–100% of full scale over a range of frequencies from 50 to 200,000 Hz.

28. The method of claim 20, wherein the integrator has an indicated accuracy of better than about 1% from about 10%–100% of full scale over a range of frequencies from 50 to 200,000 Hz.

29. The sensor system according to claim 24, wherein said integrator has an indicated accuracy of better than about 1% from about 10%–100% of full scale over a range of frequencies from 50 to 200,000 Hz.

* * * * *